US011659689B2

(12) United States Patent
Ritter

(10) Patent No.: US 11,659,689 B2
(45) Date of Patent: May 23, 2023

(54) HEATSINK ASSEMBLY FOR AN ELECTRONIC DEVICE

(71) Applicant: InterDigital Madison Patent Holdings, SAS, Paris (FR)

(72) Inventor: Darin Bradley Ritter, Indianapolis, IN (US)

(73) Assignee: InterDigital Madison Patent Holdings, SAS, Paris (FR)

( * ) Notice: Subject to any disclaimer, the term of this patent is extended or adjusted under 35 U.S.C. 154(b) by 60 days.

(21) Appl. No.: 16/970,346

(22) PCT Filed: Feb. 19, 2019

(86) PCT No.: PCT/IB2019/000218
§ 371 (c)(1),
(2) Date: Aug. 15, 2020

(87) PCT Pub. No.: WO2019/159014
PCT Pub. Date: Aug. 22, 2019

(65) Prior Publication Data
US 2021/0092867 A1    Mar. 25, 2021

Related U.S. Application Data

(60) Provisional application No. 62/632,254, filed on Feb. 19, 2018.

(51) Int. Cl.
*H05K 7/20* (2006.01)
*F28F 13/06* (2006.01)
(52) U.S. Cl.
CPC .......... *H05K 7/2039* (2013.01); *F28F 13/06* (2013.01)

(58) Field of Classification Search
None
See application file for complete search history.

(56) References Cited

U.S. PATENT DOCUMENTS

| 6,101,089 A | 8/2000 | Seto et al. |
| 6,385,048 B2 | 5/2002 | Mellberg et al. |
| 6,717,799 B2 | 4/2004 | Hamano et al. |
| 6,970,356 B2 | 11/2005 | Peng |

(Continued)

FOREIGN PATENT DOCUMENTS

| CN | 102656961 A | 9/2012 |
| CN | 106413369 A | 2/2017 |

(Continued)

OTHER PUBLICATIONS

English Language Translation, Chinese Publication No. 106413369 A, 18 pages.

*Primary Examiner* — Courtney L Smith
(74) *Attorney, Agent, or Firm* — Condo Roccia Koptiw LLP

(57) ABSTRACT

A heatsink assembly for an electronic device is described. The heatsink assembly includes a shield, a thermally conductive spacer and a heatsink. The shield has at least one indentation on a surface thereof that is positioned over a component needing thermal dissipation that is attached to the printed circuit board. The thermally conductive spacer is positioned within the at least one indentation on the shield. The heatsink is positioned over the thermally conductive spacer and fastened to the printed circuit board.

11 Claims, 5 Drawing Sheets

(56) References Cited

U.S. PATENT DOCUMENTS

| | | | |
|---|---|---|---|
| 7,317,618 B2 | 1/2008 | Robinson et al. | |
| 8,081,476 B2 * | 12/2011 | Tsao | H05K 9/0032 |
| | | | 257/713 |
| 9,907,208 B2 * | 2/2018 | Bose | H05K 7/2039 |
| 10,314,204 B2 * | 6/2019 | Ritter | H05K 7/1427 |
| 10,957,620 B2 * | 3/2021 | Chung | H05K 1/0203 |
| 2007/0082550 A1 | 4/2007 | Hemmah et al. | |
| 2011/0096505 A1 * | 4/2011 | Inoue | H05K 9/0026 |
| | | | 361/706 |
| 2012/0063038 A1 | 3/2012 | Yin et al. | |
| 2012/0300405 A1 | 11/2012 | Weeber et al. | |
| 2015/0201533 A1 * | 7/2015 | Daughtry, Jr. | H05K 9/0028 |
| | | | 29/840 |
| 2017/0181265 A1 * | 6/2017 | Hunt | H05K 1/0216 |
| 2017/0181266 A1 | 6/2017 | Hunt et al. | |
| 2017/0196121 A1 * | 7/2017 | Trygubova | H05K 7/2049 |
| 2020/0022281 A1 * | 1/2020 | Diep | H05K 9/006 |

FOREIGN PATENT DOCUMENTS

| | | |
|---|---|---|
| EP | 2933833 A1 | 10/2015 |
| WO | WO 2016018544 A1 | 2/2016 |

* cited by examiner

HEATSINK ASSEMBLY FOR AN ELECTRONIC DEVICE

CROSS REFERENCE TO RELATED APPLICATIONS

This application is the national stage entry under 35 U.S.C. § 371 of International Application PCT/162019/000218, filed Feb. 19, 2019, which was published in accordance with PCT Article 21(2) on Aug. 22, 2019, in English, and which claims the benefit of U.S. Provisional Application No. 62/632,254, filed Feb. 19, 2018.

FIELD

The disclosure generally relates to electronic devices. At least one embodiment relates to an electronic device including a heatsink.

BACKGROUND

Thermal management remains a significant challenge in electronic devices such as set top boxes, computers, game consoles, DVD players, CD players, etc. With the introduction of more components having increased processing capabilities and increased functionalities, which tend to produce more heat, the need for an improved thermal management system exists.

An additional complication in the trend of electronic devices is the need to reduce the size of the device due to consumer preference. This trend for compactness also makes thermal management a challenge, because greater compactness with an increased number of internal components generally results in a higher concentration of heat.

Proper thermal contact between a thermal pad on a circuit board component and a heatsink improves heat dissipation from the circuit board. Additionally, heat spreaders (i.e., heatsinks) with associated shields (e.g., Radio Frequency or Ground shields) are often used to contain or prevent frequency interference generated by the electronic components on the circuit board, and can also operate to improve heat dissipation from one or more electronic components. However, those of skill in the art will appreciate that existing structure and techniques for securing a shield with an associated heatsink against the thermal pad of a particular component may result in insufficient grounding of the heatsink within the electronic device.

Therefore, a need exists to provide sufficient grounding of the heatsink to the printed circuit board through the component shield without negatively impacting the required heat dissipation of one or more components contained within the confines of the shield.

SUMMARY

According to a first aspect of the disclosure, a heatsink assembly is described. The heatsink assembly comprises a shield, a thermally conductive spacer and a heatsink. The shield has at least one indentation on a surface thereof that is positioned over a component needing thermal dissipation that is attached to the printed circuit board. The thermally conductive spacer is positioned within the at least one indentation on the shield. The heatsink is positioned over the thermally conductive spacer and fastened to the printed circuit board.

In another embodiment, the thermally conductive spacer has a thickness such that a top surface of the thermally conductive spacer extends above a height for the indentation providing a gap between the surface of the shield and the heatsink so the heatsink does not contact the shield when fastened to the printed circuit board.

In another embodiment, the shield has a plurality of openings therethrough adjacent to the at least one indentation.

In another embodiment, the shield is coupled to a shield frame mounted on the printed circuit board.

In another embodiment, the heatsink assembly further comprises a thermal pad interposed between the component and the shield.

In another embodiment, the heatsink assembly further comprises at least one fastener that fastens the shield, thermally conductive spacer and heatsink to the printed circuit board.

In another embodiment, the plurality of fasteners may be one or more of a compression spring pin and a spring clip.

According to a second aspect of the disclosure, a heatsink assembly for an electronic device is described. The electronic device includes a printed circuit board and a heatsink assembly. The electronic device may be a set top box. The electronic device may include a casing, a printed circuit board with a wall of the casing that abuts a portion of a side of the printed circuit board and a heatsink assembly. The heatsink assembly comprises a shield, a thermally conductive spacer and a heatsink. The shield has at least one indentation on a surface thereof that is positioned over a component needing thermal dissipation that is attached to the printed circuit board. The thermally conductive spacer is positioned within the at least one indentation on the shield. The heatsink is positioned over the thermally conductive spacer and fastened to the printed circuit board.

In another embodiment, the thermally conductive spacer has a thickness such that a top surface of the thermally conductive spacer extends above a height for the indentation providing a gap between the surface of the shield and the heatsink so the heatsink does not contact the shield when fastened to the printed circuit board.

In another embodiment, the shield has a plurality of openings therethrough adjacent to the at least one indentation.

In another embodiment, the shield is coupled to a shield frame mounted on the printed circuit board.

In another embodiment, the heatsink assembly further comprises a thermal pad interposed between the component and the shield.

In another embodiment, the heatsink assembly further comprises at least one fastener that fastens the shield, thermally conductive spacer and heatsink to the printed circuit board.

In another embodiment, the plurality of fasteners may be one or more of a compression spring pin and a spring clip.

BRIEF DESCRIPTION OF THE DRAWINGS

These and other aspects, features and advantages of the present disclosure will be described or become apparent from the following detailed description of the preferred embodiment, which is to be read in connection with the accompanying drawings.

In the drawings, wherein the like reference numerals denote similar elements throughout the views.

It should be understood, that the drawings are for purposes of illustrating the concepts of the disclosure and are not necessarily the only possible configuration for illustrating the disclosure.

DETAILED DESCRIPTION

The present description illustrates the principles of the present disclosure. It will thus be appreciated that those skilled in the art will be able to devise various arrangements that although not explicitly described or shown herein, embody the principles of the disclosure and are included within the spirit and scope.

All examples and conditional language recited herein are intended for instructional purposes to aid the reader in understanding the principles of the disclosure and the concepts contributed by the inventor to furthering the art and, are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed to perform the same function, regardless of structure.

Figure 1:
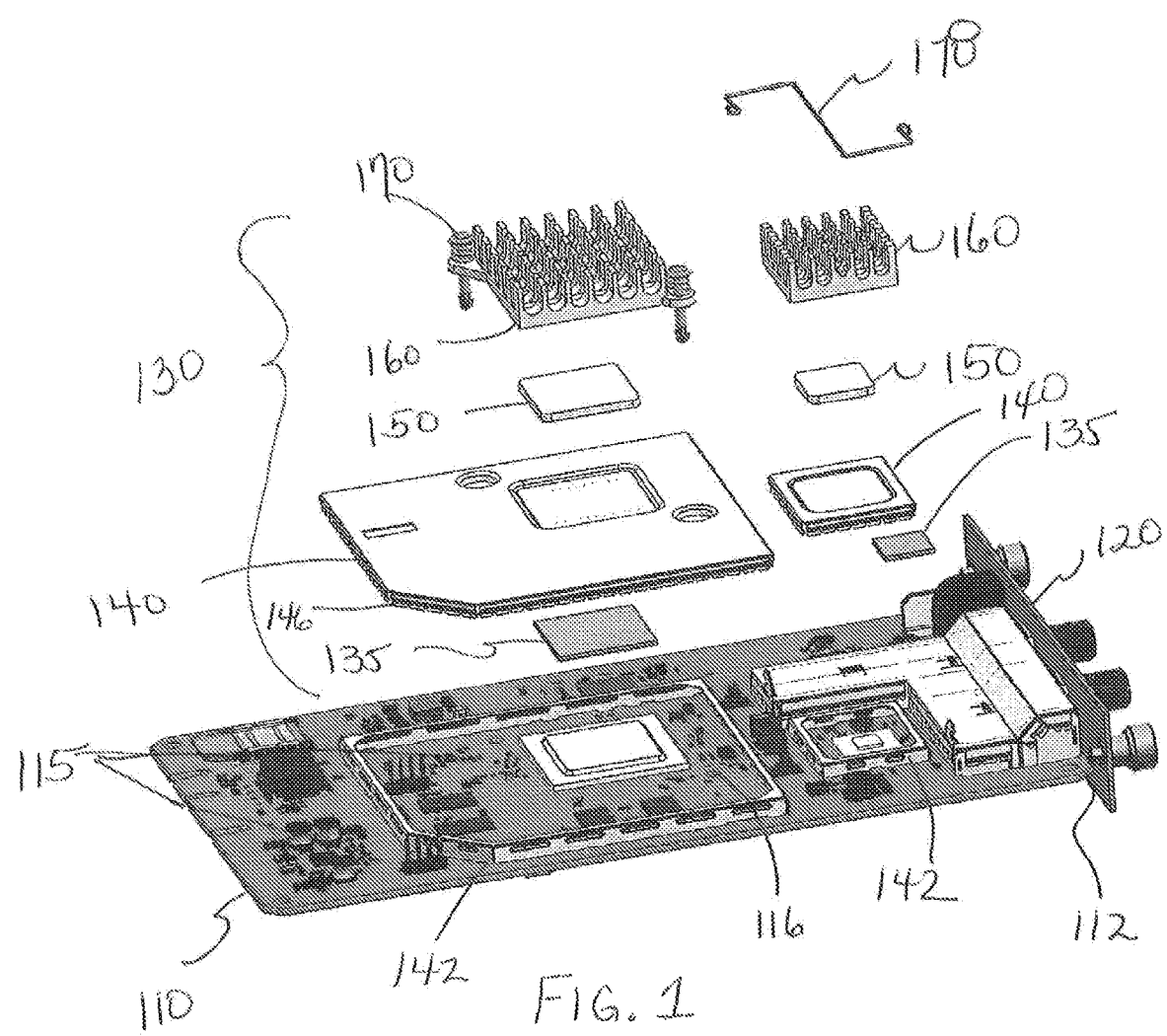
FIG. 1 is a view showing a portion of a printed circuit board (PCB) and faceplate panel of an electronic device of the present disclosure with an expanded view of an exemplary heatsink assembly.

FIG. 1 shows a partial view of an electronic device 100 of the present disclosure. The electronic device may include for example a set top box, a computer, a game console, a DVD player, and a CD player. The electronic device 100 comprises at least one printed circuit board (PCB) 110, a heatsink assembly 130 and a faceplate 120 assembled in a casing (not shown). One edge 112 of the PCB 110 is attached to a surface of the faceplate 120 when the electronic device 100 is assembled.

An expanded view of one embodiment of a heatsink assembly 130 of the disclosure is shown in FIG. 1. The heatsink assembly 130 includes a thermal pad 135, a shield 140, a spacer 150, a heatsink 160 and a fastener 170. The heat assembly will be discussed below with reference to FIGS. 2-5

Figure 2:
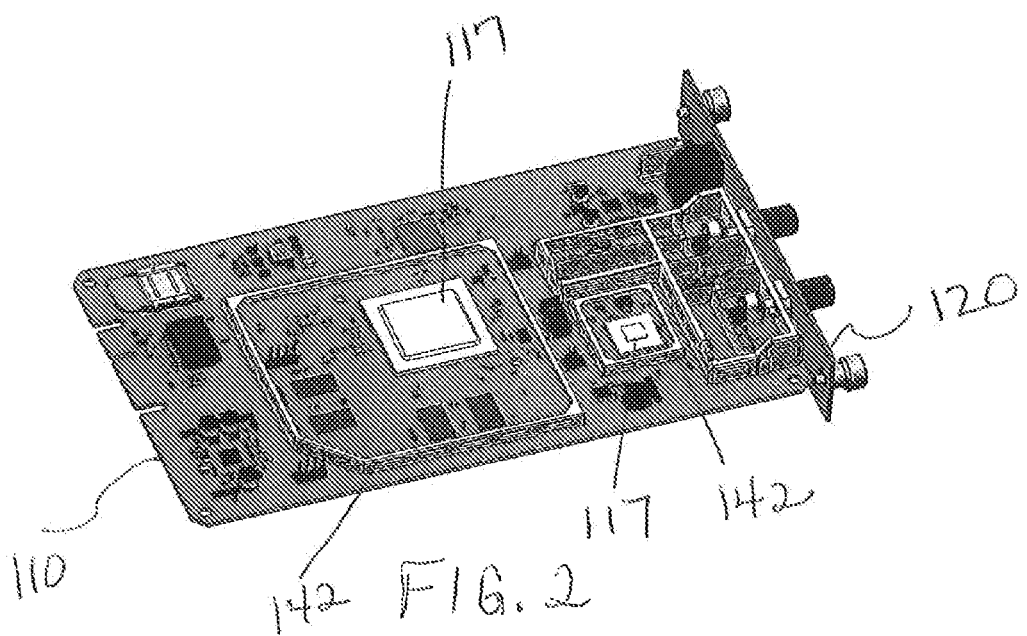
FIG. 2 depicts a top view of the printed circuit board of FIG. 1 showing shield frames attached thereto.

A top view of the PCB 110 attached to the faceplate 120 is illustrated in FIG. 2. A plurality of electrical and/or optical components are attached to the PCB 110 and are generally indicated by reference number 115. The electrical and/or optical components may be soldered or bonded with an epoxy to the PCB.

One or more shield frames 142 are attached to the printed circuit board (PCB) 110. Each shield frame 142 surrounds a portion of the plurality of electrical and/or optical components requiring heat dissipation and shielding from frequency interference. Components 117 shown in FIG. 2 require heat dissipation. Such components may be for example, semiconductor devices such as power transistors.

Each shield frame 142 is attached to the printed circuit board (PCB) 110 with tabs (not shown) that protrude through to the underside of the printed circuit board (PCB) 110. The shield frame 142 is used to couple a shield 140 over and around the plurality of electrical and/or optical components requiring heat dissipation as well as shielding from radio frequency interference. Generally, those skilled in the art will appreciate that the shield functions primarily to shield radio frequency interference from radiating to surrounding components from components contained within the shield, or radio frequency interference generated outside the shield from affecting those components within the shield. The exemplary embodiment illustrated in FIG. 2 depicts two shield frames 142.

Thermal pads 135 are placed directly on top of the components 117 (FIG. 1). The thermal pads facilitate heat transfer from the component 117 to the heatsink 160 (FIG. 1). The thermal pads may be for example, a pre-formed square or rectangle of solid material such as silicone. The thermal pads are relatively firm at room temperature but, can become soft at higher temperatures and may also fill air gaps caused by imperfectly flat or smooth surfaces which should be in thermal contact.

Figure 3:
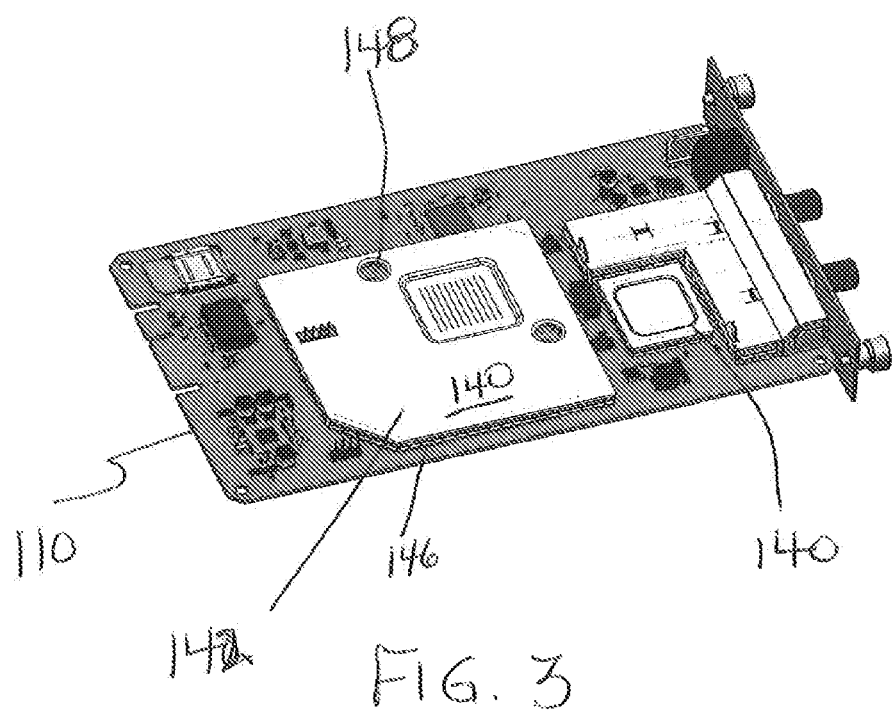
FIG. 3 shows shields coupled to the shield frames depicted in FIG. 2.

Referring to FIG. 3, shields 140 are shown coupled to the shield frames 142. Each shield 140 is placed over a respective thermal pad 135 and component 117. The shield contacts the top of the thermal pad 135 (shown in FIG. 1) to facilitate heat transfer away from the component 117.

The shield 140 is formed of a material suitable for protecting components from radio frequency interference. An example of a suitable material may be a metal such as for example, aluminum.

In one embodiment, the shield 140 has a topographic surface 145 that is generally planar with respect to the surface of the PCB 110. However, the surface 145 of shield 140 may be contoured (or indented) to be consistent with the topography of electrical and/or optical components mounted thereunder on the PCB 110. The indentations preferably provide contact between the shield 140 and the thermal pad 135 to facilitate thermal transfer to the heatsink 160. The topographic surface 145 also provides a suitable height for the shield 140 when it is coupled to the shield frame 142, such that it does not contact the underlying electrical and/or optical components that do not need heat dissipation.

A plurality of fingers 146 extend perpendicularly from the periphery of the surface 145 of shield 140. The fingers 146 are preferably formed of a material suitable for electromagnetic compliant (EMC) shielding of electrical and/or optical components. An example of a suitable material may be a metal such as for example, aluminum.

The fingers 146 are preferably spring fingers that press onto the shield frame 142 attached to the PCB 110. The plurality of fingers 148 locate the shield 140 on the PCB 110 and minimize lateral side-to-side movement of the shield 140 during and after assembly.

The surface 146 of the shield 140 may optionally include at least one opening 148 therethrough. Each of the at least one openings 148 is positioned adjacent to components 117 and will facilitate attachment of the heatsink thereon, as discussed below.

Figure 4:
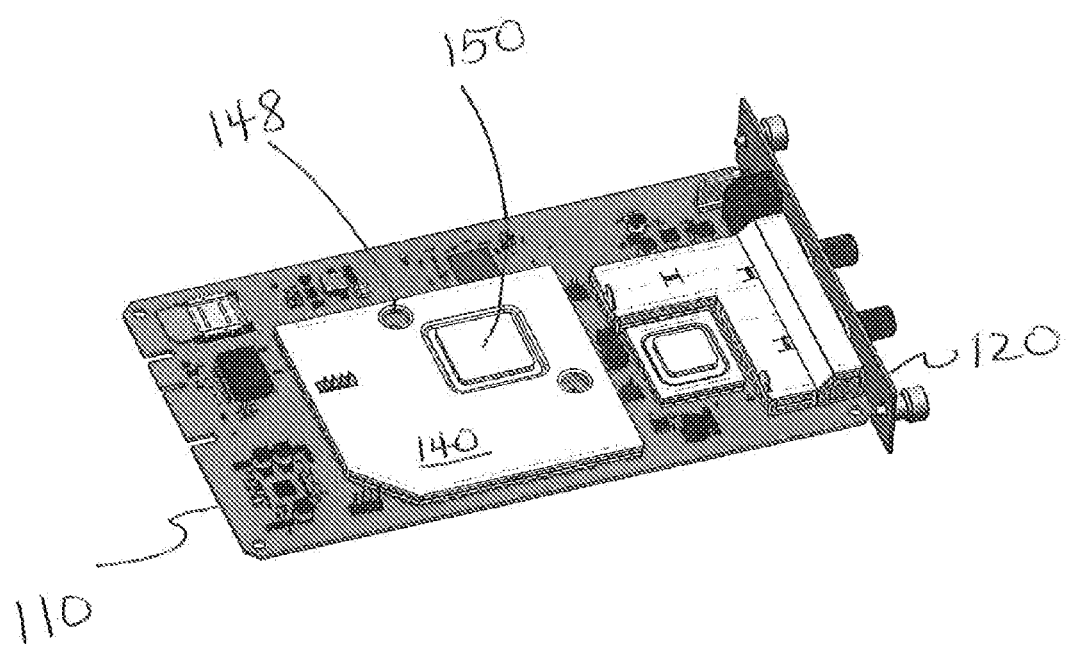
FIG. 4 depicts spacers positioned on the shields shown in FIG. 3.

Referring to FIG. 4, spacers 150 are placed directly on top of the shields 140 and positioned in the indented area over component 117. The spacers 150 facilitate heat transfer from the component 117 to the heatsink 160 (FIG. 1) when the heatsink assembly 130 is assembled. The spacers may be for example, a pre-formed square or rectangle of a thermally conductive material such as, for example, aluminum.

The spacers 150 additionally have a thickness such that a top surface of the thermally conductive spacer extends above a height for the indentation providing a gap between the surface of the shield 145 and the heatsink 160, so the heatsink does not contact the shield when fastened to the printed circuit.

Figure 5:
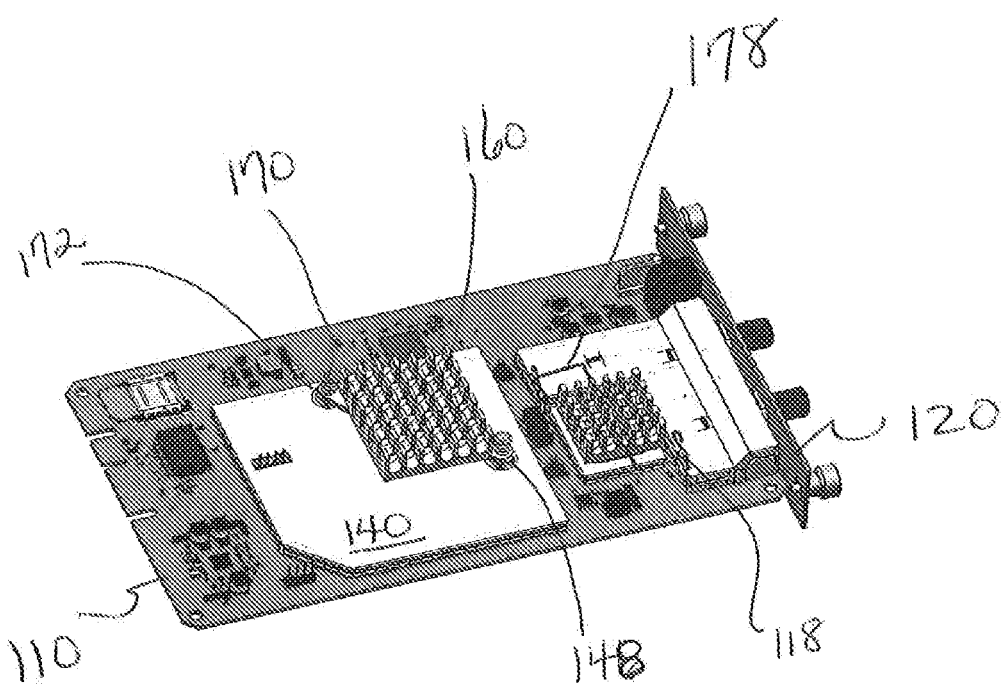
FIG. 5 illustrates heatsinks attached over the spacers depicted in FIG. 4.

FIG. 5 shows the heatsink attached over the spacer (not shown) on the shield 140. The heatsink 160 dissipates the heat generated by component 117 to the fluid medium (air) surrounding it, thereby allowing regulation of the component temperature at optimal levels. The heatsink is typically an oversized structure designed to maximize the surface area in contact with the cooling medium (air) surrounding it. In one exemplary embodiment, the heatsink has a plurality of fins protruding upward from a solid base (FIG. 1). The plurality of fins maximizes the surface area in contact with air flow providing cooling thereto. The heatsink is typically formed of a metal such as copper or aluminum.

The heatsink 160 includes fasteners 170, 178 for attachment to the printed circuit board 110. In one exemplary embodiment, the fasteners 170 are two compression spring pins. For such an embodiment, the heatsink includes openings 172 that align with openings 148 in the shield 140 and openings 116 (FIG. 1) in the printed circuit board 110. The spring pins typically have a flexible barb at the end that engages with the opening in the PCB to retain the pin. The compression pin holds the heatsink assembly 130 together and maintains contact between the heatsink 160 and component 117.

In another exemplary embodiment, the fastener 178 is a spring clip. The spring clip extends over a portion of the heatsink and is attached at either end to posts 118 (FIG. 1) attached to the surface of the printed circuit board. The clip flexibly holds the heatsink assembly 130 together and maintains contact between the heatsink 160 and component 117.

Although embodiments have been described hereinabove with reference to specific examples, modifications will be apparent to a skilled person in the art which lie within the scope of the claims.

Many further modifications and variations will suggest themselves to those versed in the art upon making reference to the foregoing illustrative embodiments, which are given by way of example only and which are not intended to limit the scope of the present disclosure, that being determined solely by the appended claims. In particular, the different features from different embodiments may be interchanged, where appropriate.

The invention claimed is:

1. A heatsink assembly, comprising:
   a shield having at least one indentation in a surface thereof for positioning over a component attached to a printed circuit board;
   a thermally conductive spacer positioned on the at least one indentation on the shield;
   a heatsink positioned over the thermally conductive spacer and for fastening to the printed circuit board, the thermally conductive spacer having a thickness such that a top surface of the thermally conductive spacer extends above a height of the at least one indentation, thereby providing a gap between the surface of the shield and the heatsink so the heatsink does not contact the shield when the heatsink is fastened to the printed circuit board; and
   at least one fastener that fastens the shield, the thermally conductive spacer, and the heatsink to the printed circuit board.

2. The heatsink assembly of claim 1, wherein the shield has a plurality of openings therethrough adjacent to the at least one indentation.

3. The heatsink assembly of claim 1, wherein the shield is coupled to a shield frame mounted on the printed circuit board.

4. The heatsink assembly of claim 1, further comprising a thermal pad interposed between the component and the shield.

5. The heatsink assembly of claim 1, wherein the at least one fastener is one or more of a compression spring pin and a spring clip.

6. An electronic device, comprising:
   the heatsink assembly of claim 1.

7. A set top box, comprising:
   a casing;
   a printed circuit board, wherein a wall of the casing abuts a portion of a side of the printed circuit board; and
   a heatsink assembly comprising:
      a shield having at least one indentation in a surface thereof for positioning over a component attached to the printed circuit board;
      a thermally conductive spacer positioned on the at least one indentation on the shield;
      a heatsink positioned over the thermally conductive spacer and for fastening to the printed circuit board, the thermally conductive spacer having a thickness such that a top surface of the thermally conductive spacer extends above a height of the at least one indentation, thereby providing a gap between the surface of the shield and the heatsink so the heatsink does not contact the shield when the heatsink is fastened to the printed circuit board; and
      at least one fastener that fastens the shield, the thermally conductive spacer, and the heatsink to the printed circuit board.

8. The set top box of claim 7, wherein the shield has a plurality of openings therethrough adjacent to the at least one indentation.

9. The set top box of claim 7, wherein the shield is coupled to a shield frame mounted on the printed circuit board.

10. The set top box of claim 7, further comprising a thermal pad interposed between the component and the shield.

11. The set top box of claim 7, wherein the at least one fastener is one or more of a compression spring pin and a spring clip.

* * * * *